(12) United States Patent  
Noteboom et al.

(10) Patent No.: US 8,913,381 B2  
(45) Date of Patent: Dec. 16, 2014

(54) COLD ROW ENCAPSULATION FOR SERVER FARM COOLING SYSTEM

(71) Applicant: Yahoo! Inc., Sunnyvale, CA (US)

(72) Inventors: Scott Noteboom, San Jose, CA (US); Albert Dell Robison, Placerville, CA (US); Jesus Suarez, Fremont, CA (US); Norman Holt, Oakley, CA (US)

(73) Assignee: Yahoo! Inc., Sunnyvale, CA (US)

( * ) Notice: Subject to any disclaimer, the term of this patent is extended or adjusted under 35 U.S.C. 154(b) by 0 days.

(21) Appl. No.: 13/791,901

(22) Filed: Mar. 8, 2013

(65) Prior Publication Data

US 2013/0188310 A1    Jul. 25, 2013

Related U.S. Application Data

(63) Continuation of application No. 12/193,113, filed on Aug. 18, 2008, now Pat. No. 8,395,891, which is a continuation of application No. 11/757,864, filed on Jun. 4, 2007, now Pat. No. 7,430,118.

(51) Int. Cl.
 *G06F 1/20* (2006.01)
 *H05K 7/20* (2006.01)
 *F24F 11/00* (2006.01)

(52) U.S. Cl.
 CPC ............ *G06F 1/20* (2013.01); *F24F 11/0008* (2013.01); *H05K 7/20745* (2013.01); *H05K 7/20145* (2013.01)
 USPC ............ 361/679.48; 361/679.47; 361/679.53; 361/694; 361/695; 361/696; 165/80.5; 165/104.22; 165/104.33; 165/121; 312/223.2; 312/223.3; 62/259.2; 454/184

(58) Field of Classification Search
 USPC ............... 361/679.46–679.53, 690–696, 688, 361/689, 704–712, 715, 719–727, 831; 165/80.2, 80.3, 80.4, 80.5, 104.22, 165/104.33, 121–127, 185; 312/223.2, 312/223.3, 236; 62/3.3, 3.2, 3.7, 59, 135, 62/137, 259.2; 454/137, 184, 256
 See application file for complete search history.

(56) References Cited

U.S. PATENT DOCUMENTS

| | | | | |
|---|---|---|---|---|
| 6,034,873 | A * | 3/2000 | St.ang.hl et al. | 361/701 |
| 7,266,964 | B2 * | 9/2007 | Vogel et al. | 62/259.2 |
| 7,278,273 | B1 * | 10/2007 | Whitted et al. | 62/259.2 |
| 7,325,410 | B1 * | 2/2008 | Bean, Jr. et al. | 62/137 |
| 7,916,470 | B2 * | 3/2011 | Mills et al. | 361/679.49 |
| 8,498,114 | B2 * | 7/2013 | Martini | 361/695 |
| 2004/0184232 | A1 * | 9/2004 | Fink | 361/690 |
| 2006/0260338 | A1 * | 11/2006 | VanGilder et al. | 62/259.2 |
| 2007/0146994 | A1 * | 6/2007 | Germagian et al. | 361/695 |
| 2007/0281639 | A1 * | 12/2007 | Clidaras et al. | 455/128 |
| 2007/0283710 | A1 * | 12/2007 | Gilbert et al. | 62/259.2 |
| 2008/0291626 | A1 * | 11/2008 | Nelson et al. | 361/696 |

* cited by examiner

*Primary Examiner* — Michail V Datskovskiy
(74) *Attorney, Agent, or Firm* — Martine Penilla Group, LLP

(57) ABSTRACT

A server cooling device is described that includes an enclosure defining an interior space and at least one server rack port configured to engage a rack such that one or more rack mounted units installed in the rack interface with the interior space. The server cooling device also includes a mixing chamber including one or more cooling coils that is connected to the interior space defined by the enclosure.

20 Claims, 5 Drawing Sheets

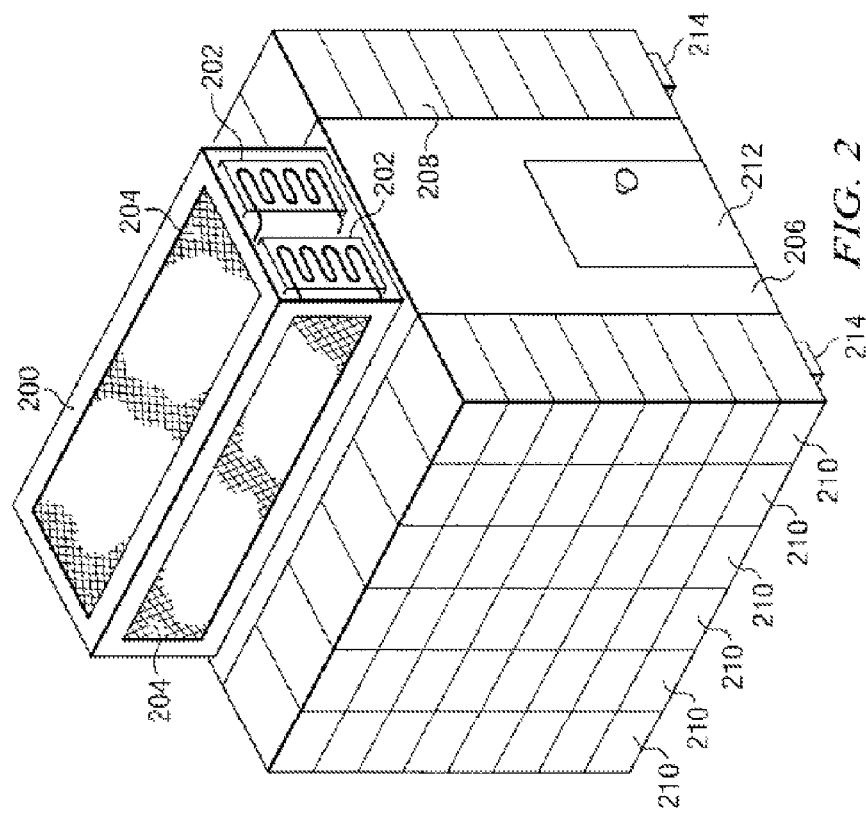
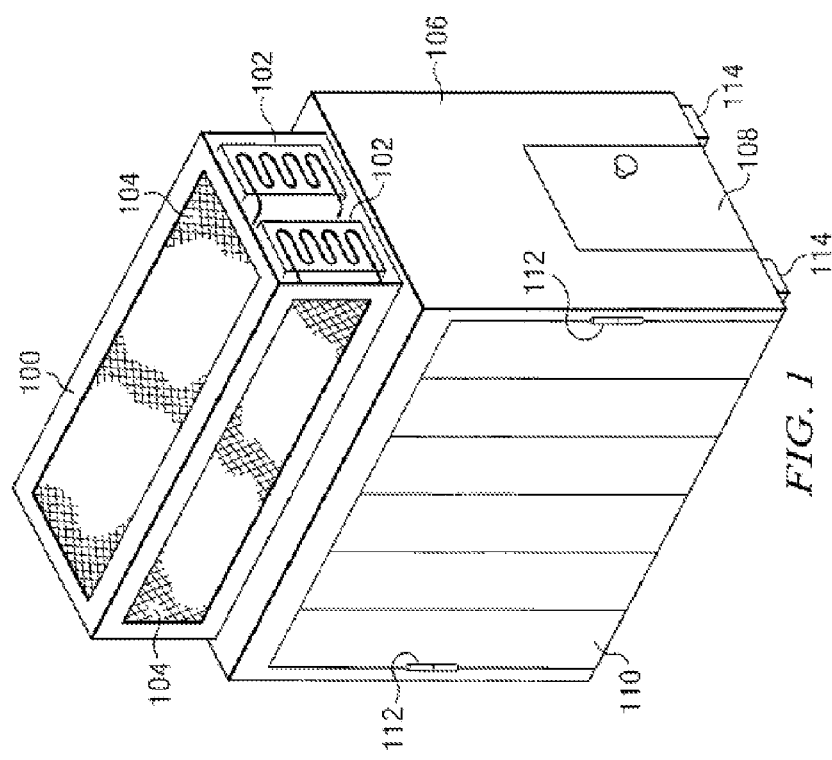

COLD ROW ENCAPSULATION FOR SERVER FARM COOLING SYSTEM

CROSS REFERENCE TO RELATED APPLICATION

The present application is a continuation application of U.S. patent application Ser. No. 12/193,113 filed Aug. 18, 2008, which is a continuation application of U.S. patent application Ser. No. 11/757,864 filed Jun. 4, 2007, which issued as U.S. Pat. No. 7,430,118 on Sep. 30, 2008. Priority is claimed to both of these applications. The disclosures of both of these applications are hereby incorporated by reference for all purposes.

TECHNICAL FIELD

The present disclosure relates generally to cooling systems for data centers.

BACKGROUND

The rapid growth of Internet services such as Web email, Web search, Web site hosting, and Web video sharing is creating increasingly high demand for computing and storage power from servers in data centers. While the performance of servers is improving, the power consumption of servers is also rising despite efforts in low power design of integrated circuits. For example, one of the most widely used server processors, AMD's Opteron processor, runs at up to 95 watts. Intel's Xeon server processor runs at between 110 and 165 watts. Processors are only part of a server, however; other parts in a server such as cooling fans and storage devices consume additional power.

Servers are typically placed in racks in a data center. There are a variety of physical configurations for racks. A typical rack configuration includes mounting rails to which multiple units of equipment, such as server blades, are mounted and stacked vertically within the rack. One of the most widely used 19-inch rack is a standardized system for mounting equipment such as 1U or 2U servers. One rack unit on this type of rack typically is 1.75 inches high and 19 inches wide. A server that can be installed in one rack unit is commonly designated as a 1U server. In data centers, a standard rack is usually densely populated with servers, storage devices, switches, and/or telecommunications equipment.

A data center room should be maintained at acceptable temperatures and humidity for reliable operation of the servers, which typically have cooling fans that draw air through the chassis for cooling. The power consumption of a rack densely stacked with servers powered by Opteron or Xeon processors may be between 7,000 and 15,000 watts. As a result, server racks can produce very concentrated heat loads. The heat dissipated by the servers in the racks is exhausted to the data center room. The heat collectively generated by densely populated racks can have an adverse effect on the performance and reliability of the equipment in the racks, since they rely on the surrounding air for cooling. Accordingly, heating, ventilation, air conditioning (HAVC) systems are often an important part of the design of an efficient data center.

A typical data center consumes 10 to 40 megawatts of power. The majority of energy consumption is divided between the operation of servers and HVAC systems. HVAC systems have been estimated to account for between 25 to 40 percent of power use in data centers. For a data center that consumes 40 megawatts of power, the HAVC systems may consume 10 to 16 megawatts of power. Significant cost savings can be achieved by utilizing efficient cooling systems and methods that reduce energy use. For example, reducing the power consumption of HVAC systems from 25 percent to 10 percent of power used in data centers translates to a saving of 6 megawatts of power which is enough to power thousands of residential homes.

In a data center room, server racks are typically laid out in rows with alternating cold and hot aisles between them. All servers are installed into the racks to achieve a front-to-back airflow pattern that draws conditioned air in from the cold rows, located in front of the rack, and ejects heat out through the hot rows behind the racks. A raised floor room design is commonly used to accommodate an underfloor air distribution system, where cooled air is supplied through vents in the raised floor along the cold aisles.

An important factor in efficient cooling of data center is to manage the air flow and circulation inside a data center. Computer Room Air Conditioners (CRAC) units supply cold air through floor tiles including vents between the racks. In addition to servers, CRAC units consume significant amounts of power as well. One CRAC unit may have up to three 5 horsepower motors and up to 150 CRAC units may be needed to cool a data center. The CRAC units collectively consume significant amounts of power in a data center. For example, in a data center room with hot and cold row configuration, hot air from the hot rows is moved out of the hot row and circulated to the CRAC units. The CRAC units cool the air. Fans powered by the motors of the CRAC units supply the cooled air to an underfloor plenum defined by the raised sub-floor. The pressure created by driving the cooled air into the underfloor plenum drives the cooled air upwardly through vents in the subfloor, supplying it to the cold aisles where the server racks are facing. To achieve a sufficient air flow rate, hundreds of powerful CRAC units may be installed throughout a typical data center room. However, since CRAC units are generally installed at the corners of the data center room, their ability to efficiently increase air flow rate is negatively impacted. The cost of building a raised floor generally is high and the cooling efficiency generally is low due to inefficient air movement inside the data center room. In addition, the location of the floor vents requires careful planning throughout the design and construction of the data center to prevent short circuiting of supply air. Removing tiles to fix hot spots can cause problems throughout the system.

SUMMARY

The present invention provides systems and methods directed to efficient cooling of data centers. In a particular embodiment, the present invention provides a cold row encapsulation structure comprising at least one server rack port configured to interface with one or more server racks and a cooling module connected to the top surface of the cold row encapsulation structure. The server rack ports are configured to engage the server racks such that a front face of the server racks interface with the interior space defined by the cold row encapsulation structure. In some embodiments, server racks ports and server racks are tightly connected by clamps and/or sealing gaskets to reduce air leakage into and out of the cold row encapsulation structure.

Some embodiments of the invention utilize cooling fans of the servers installed on the racks to draw cold air from cold row encapsulation structure from the front face of the server racks and to eject hot air from the back side of the server racks. Some embodiments of the invention obviate the need for raised subfloors, and the fans and other equipment for forcing cooled air into an underfloor plenum. The cooling module installed on top of the cold row encapsulation structure cools the hot air through cooling coils installed inside the cooling module. In some embodiments, cold water is used inside the coils to exchange heat with hot air in the cooling module.

In one embodiment of the present invention, the systems and methods are directed to cooling hot air inside the data center server cooling room without introducing outside air. The hot air ejected by the server fans enters the cooling modules that may be located on top of the cold row encapsulation structure. The hot air is cooled by the water based cooling coils inside the cooling modules and the cooled air enters the cold row encapsulation structure through gravity and the lower pressure created inside the interior space of the cold row encapsulation structure. Server fans draw cold air from the server rack ports connected to the cold row encapsulation structure to cool the servers and eject hot air from the back side of the server racks.

In other embodiments of the present invention, the systems and methods involve mixing outside cool air to cool the servers. In one embodiment, ceiling dampers in a data center may be controlled by a temperature control unit and opened up when the outside temperature reaches certain threshold value. Outside air enters the data center and passes through the cooling module installed on top of the cold row encapsulation structure. Server fans draw the cold air from the cold row encapsulation structure. Hot air is exhausted to the outside by the ceiling exhaust fans. In some embodiments, to control the moisture in the air in the data center server cooling room, especially when the outside air fails to meet the operating requirements for the servers and other equipment, humidifiers may be used to condition the outside air. In recent years, however, manufacturers of server equipment have significantly relaxed the humidity requirements due to technological advancement.

The following detailed description together with the accompanying drawings will provide a better understanding of the nature and advantages of various embodiments of the present invention.

DESCRIPTION OF THE DRAWINGS

FIG. 1 is a diagram showing an example cold row encapsulation structure and an example cooling module.

FIG. 2 is a diagram showing an example cold row encapsulation structure with integrated server racks and an example cooling module.

DESCRIPTION OF EXAMPLE EMBODIMENT(S)

Figure 3:
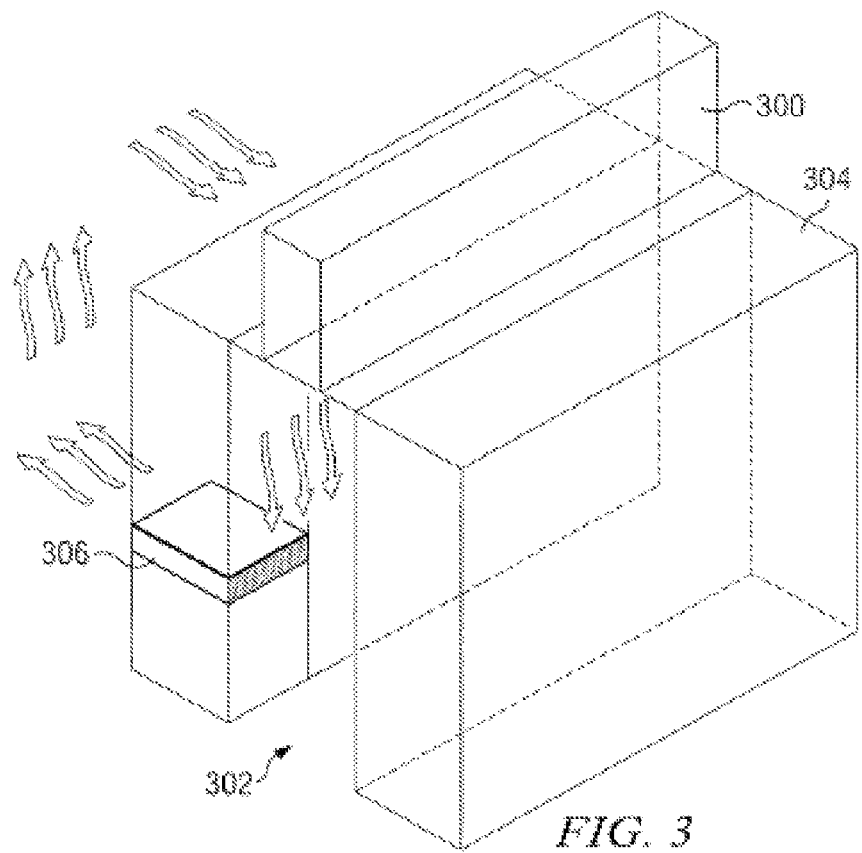
FIG. 3 is a diagram showing an example cold row encapsulation structure with integrated server racks, an example server placed on one of the server racks, and an example cooling module.

The following example embodiments and their aspects are described and illustrated in conjunction with apparatuses, methods, and systems which are meant to be illustrative examples, not limiting in scope.

FIG. 1 illustrates an example cooling module 100 and an example cold row encapsulation structure 106. The cold row encapsulation structure 106 may have a frame, panels, doors, and server rack ports. A server rack port is an opening on the cold row encapsulation structure 106 that can be connected to a server rack. The cold row encapsulation structure 106 may be made of a variety of materials such as steel, composite materials, or carbon materials that create a housing defining an interior space including at least one server rack port that allows a rack-mounted unit to interface with the interior space. In some embodiments, the cold row encapsulation structure 106 may be mounted directly to the floor surface and no raised floor is required in a data center cooling room for cooled air.

The cooling module 100 may be located and positioned on top of the cold row encapsulation structure 106 and connected to the top surface of the cold row encapsulation structure 106. The cooling module 100 comprises one or more cooling coils 102. Liquid passing inside the cooling coils 102 is used to exchange heat with relatively hot air passing through the cooling module 100, thereby cooling the air. In one embodiment, the cooling module 100 further comprises an enclosure inside which the cooling coils 102 are located. The cooling module enclosure may have one or more openings 104 through which air enter the enclosure. In some embodiments, the openings 104 may comprise air filters. The cooling module enclosure may have one or more openings connected to the top surface of the cold row encapsulation structure 106, through which openings cold air exits the cooling module and enters the interior space defined by the cold row encapsulation structure.

In some embodiments, water is used inside the cooling coils 102 as heat exchangers. Water pumps, water cooling equipment, and associated plumbing (not illustrated) supplies cooled water to the cooling coils 102. In other embodiments, other types of liquid such as a water-glycol solution, steam, or a refrigerant may be used inside the cooling coils 102 as heat exchangers.

In some embodiments, the cooling coils 102 may be serpentine shaped lines of tubing. In other embodiments, the cooling coils 102 may be in other shapes such as straight lines of tubing. Depending on the size of the cold row encapsulation structure 106, the cooling requirements, the velocity of air flow, and the physical characteristics of the cooling coils 102, the number of cooling coils in the cooling module 100 may vary. In one embodiment, two cooling coils are used inside the cooling module 100.

Since cold air is generally heavier than hot air, the cold air cooled by the cooling coils 102 generally moves downward into the interior space defined by the cold row encapsulation structure 106 which may be located below and connected to the cooling module 100. The cold row encapsulation structure 106 comprises an enclosure which defines an interior space. The enclosure comprises at least one server rack port 110 configured to interface with a plurality of server racks. The server rack port 110 is configured to interface with the server racks such that a front face of the server racks intersects the interior space of the cold row encapsulation structure 106. In one embodiment, six standard server racks may be connected to the server rack port 110. In another embodiment, twelve standard server racks may be connected to the server rack port 110. In some embodiments, the server racks and the server rack ports 110 may be connected together through one or more clamps 112. In other embodiments, the server racks and the server rack ports 110 may be placed next to each other. In some other embodiments, sealing materials such as gaskets may be used to tightly connect the server rack port 110 and the server racks. The servers are installed into the racks to achieve a front-to-back airflow pattern that draws conditioned air in from the cold row encapsulation structure 106 in the front, and ejects heat out behind the racks.

Figure 4:
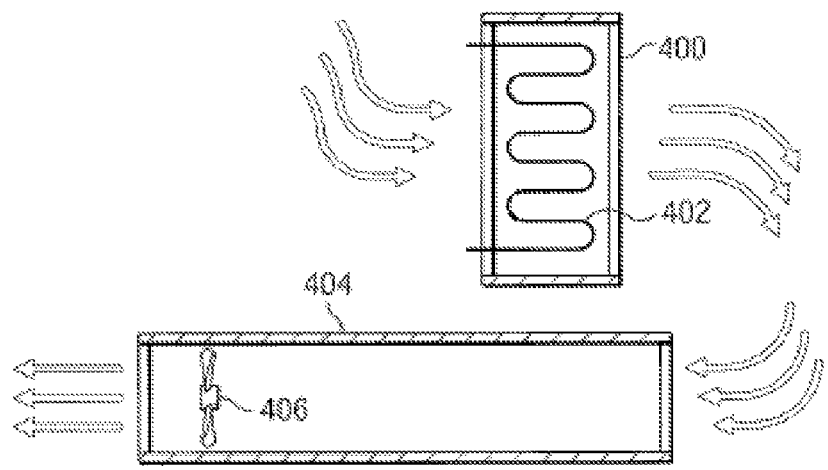
FIG. 4 is a diagram showing an example server with a server fan that draws cold air conditioned by an example cooling module.

In one embodiment, the cold row encapsulation structure 106 may comprise more than one server rack port 110. A server rack port 110 may engage a server rack such that the front face of servers or other devices installed in the server interface with the interior space defined by the cold row encapsulation structure 106. This configuration achieves a front-to-back airflow pattern, where the cooling fans of the servers or other rack-mounted units draw air from the interior space and exhaust air heated by the processor(s) and other components out the back panel, as illustrated in FIG. 4. In some embodiments, the server rack and the cold row encapsulation structure may be substantially sealed; conditioned cold air inside the interior space of the cold row encapsulation structure 106 is drawn by the server fans inside the servers to cool the servers. In other embodiments, the server rack and the cold row encapsulation structure 106 are placed next to each other so that conditioned cold air inside the interior space of the cold row encapsulation structure 106 can be drawn to the servers by the server fans inside the servers. The relatively hot air is circulated to the cooling module 100 on top of the cold row encapsulation structure 106 and exchanges heat with the cooling coils 102. Cold air from the cooling module 100 sinks to the cold row encapsulation structure 106 and is drawn to the back of the servers by server fans inside the servers. In some embodiments, server racks are sparsely populated with servers and other equipment. Since servers and other equipment are stacked vertically within the rack, the scarcity may create open gaps to the interior space of the cold row encapsulation structure. Cold air may leak from the interior space of the cold row encapsulation structure 106, and hot air may circulate back to the interior space, thereby reducing the cooling efficiency. To prevent air leakage, the gaps may be blocked by panels mounted to the server rack that prevent air from escaping and entering the cold row encapsulation structure through the gaps.

In one embodiment, the cold row encapsulation structure 106 may further comprise stability control units 114 on the bottom. The stability control units 114 may comprise components that are built to withstand seismic movements during natural disasters such as earthquakes. In some embodiments, the stability control units 114 may have devices for scrolling that can be quickly released to easily move the cold row encapsulation structure 106. When stability control units 114 are used, the cold row encapsulation structure 106 may be raised from the ground. As a result, cold air may leak and hot air may enter from the bottom side of the cold row encapsulation structure 106. To prevent air leakage, in one embodiment, the bottom side of the cold row encapsulation structure 106 may be enclosed by a panel that seals the bottom surface, on which panel the stability control units 114 may be attached.

In one embodiment, one or more doors 108 may be installed on the enclosure of the cold row encapsulation structure 106. The door 108 may be opened and closed so that data center personnel may enter the cold row encapsulation structure for a variety of tasks such as server maintenance. The door 108 may be insulated to prevent cold air from leaking out of the cold row encapsulation structure 106.

The dimension of the cold row encapsulation structure 106 can vary considerably depending on the desired number of server racks, the cooling requirements of the servers, and the like. In one embodiment, six to twelve standard server racks may be connected to respective server rack ports 110 of the cold row encapsulation structure 106. Another six to twelve standard server racks may be connected to the server rack ports on the opposite side of the cold row encapsulation structure. The distance between the opposing server rack ports may be 4 feet. The height of the cold row encapsulation structure 106 may be 12 feet and the depth may also be 12 feet.

FIG. 2 illustrates an example cooling module 200, a cold row encapsulation structure 206, and integrated server racks 208 and 210. The system in this example is similar to the one shown in FIG. 1 except that the server racks are integral parts of the system. In this embodiment, the connection and sealing between the cold row encapsulation structure 206 and the server racks 208 and 210 are no longer required since the server racks are part of the cold row encapsulation structure 206. The servers may be installed into the integrated server racks 208 and 210 to achieve a front-to-back airflow pattern. The front face of the integrated server racks 208 and 210 intersects the interior space of the cold row encapsulation structure 206. The server fans inside the servers draw cold air from the cold row encapsulation structure 206 to cool the servers and blow out relatively hot air from the back of the server racks. Hot air is then circulated to the cooling module 200 through one or more openings 204 and exchanges heat with the one or more cooling coils 202. The cooling module 200 may be located on top of the cold row encapsulation structure 206 and may be connected to the top surface of the cold row encapsulation structure 206 through an opening on the top side of the cold row encapsulation structure 206 and the bottom side the cooling module 200. Cold air generally moves downwards, especially when server fans are drawing cold air from the cold row encapsulation structure creating lower air pressure in the interior space of the cold row encapsulation structure 206.

FIG. 3 illustrates an example cooling module 300, cold row encapsulation structure 302, server racks 304, and an example server 306 placed on a server rack. The system in this example is similar to the one shown in FIG. 2. Conditioned cold air enters the cold row encapsulation structure 302 through the cooling module 300 placed on top of the cold row encapsulation structure 302. Server fans inside the server 306 draw conditioned cold air from the interior space of the cold row encapsulation structure 302 and cools the server 306.

FIG. 4 illustrates an example cooling module 400, cooling coils 402, server 404 and server fan 406 inside the server 404. Conditioned cold air from the cooling module 400 and cooling coils 402 is drawn by the server fan 406 and passes through the server 404 to cool the server. Relatively hot air is then blown out of the server 404 by the server fan 406.

Figure 5:
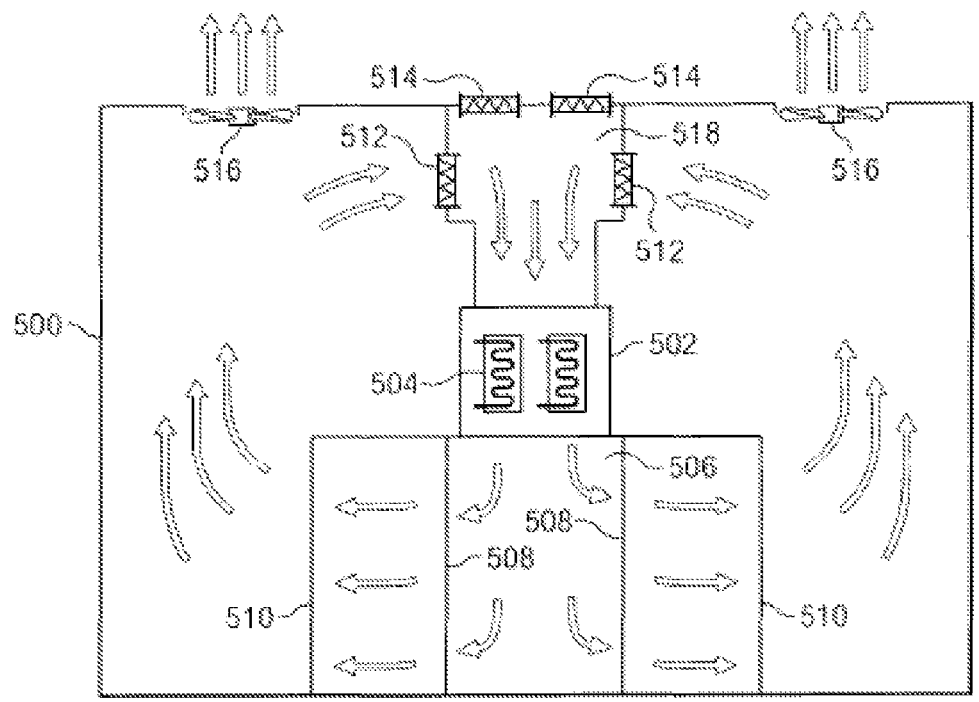
FIG. 5 is a diagram showing an example data center server cooling room with a cold row encapsulation structure, a cooling module, exhaust fans on the roof, and a mixing chamber with dampers that controls the indoor and outdoor air circulation.

The cooling systems illustrated in FIGS. 1 and 2 can operate in an interior space defined by a data center server cooling room, as disclosed above, to draw air from the interior space, and provide cooled air to the interior of the cold row encapsulation structure 106. In some implementations, however, the cooling systems may also operate in connection with a data center cooling room that includes air flow controls that allow outside air to be used. FIG. 5 illustrates an example data center server cooling room 500 with one or more ceiling exhaust fans 516, ceiling dampers 514 which controls outside air intake, a mixing chamber 518, and dampers 512 that control circulation of air entering into the mixing chamber 518. The cooling module 502 comprises one or more cooling coils 504 and is connected to the mixing chamber 518. The top surface of the cold row encapsulation structure 506 is connected to the cooling module 502. Server rack ports 508 on the enclosure of the cold row encapsulation structure 506 are connected to the server racks 510. The servers may be installed into the server racks to achieve a front-to-back airflow pattern. The front face of the server racks intersects the interior space of the cold row encapsulation structure 506. The server fans inside the servers draw cold air from the cold row encapsulation structure 506 to cool the servers and eject hot air server racks.

The server cooling room 500 may be operated in two modes. In one mode, no outside air is introduced to the server cooling room 500; the hot air ejected from the servers is circulated back to the mixing chamber 518 and the cooling module 502. In another mode, outside cool air is introduced to the server cooling room 500. The ceiling dampers 514 are open while the dampers 512 on the mixing chamber are closed. Outside cool air passes through the cooling module 502 and enters cold row encapsulation structure 506.

In one embodiment, the ceiling dampers 514 are closed and the dampers 512 on the mixing chamber are open. Part of the hot air ejected by the servers is exhausted outside of the server cooling room 500 through the one or more ceiling exhaust fans 516; part of the hot air enters the mixing chamber 518 through the open dampers 512. The hot air inside the mixing chamber is drawn to the cooling module 502 and exchanges heat with the cooling coils 504. Cold air then enters the cold row encapsulation structure 506 through gravity and lower air pressure inside the interior space of the cold row encapsulation structure 506.

In another embodiment, the ceiling dampers 514 are open and the dampers 512 on the mixing chamber are closed. The outside cool air enters the mixing chamber 518 through the open dampers 514, passes through the cooling module 504, and sinks to the interior space of the cold row encapsulation structure 506.

In some embodiments, the opening and closing of the dampers 512 and 514 may be controlled by a temperature control unit. When the outside temperature reaches an appropriate level, the temperature control unit opens up the ceiling dampers 514 to allow outside air to enter the room and closes the dampers 512 on the mixing chamber to prevent hot air ejected from the server from entering the mixing chamber. When the outside temperature is too hot for the server cooling room 500, the temperature control unit closes the ceiling dampers 514 to prevent introducing hot outside air indoors, and opens up the dampers 512 to allow hot air ejected from the servers back to the mixing chamber. Utilizing outside natural cool air significantly reduces energy consumption of data centers, as it reduces the need to cool the liquid circulating through the cooling module 100. In some embodiments, the opening and closing of the dampers 512 and 514, and the operation of the ceiling exhaust fans 516 are all controlled by an electronic device such as a temperature control unit that monitors the temperature inside and outside the server cooling room and operates the dampers and the fans to achieve optimal efficiency in cooling the room.

Depending on the location of the data center, humidity of the outside cool air may vary. When the humidity of the outside cool air is low, the outside air may have to be conditioned so that the humidity level meets the requirement for reliable operation of the servers. Although server manufacturers have significantly relaxed the requirement on humidity for reliable operation of the server equipment, the appropriate humidity of ambient air inside a data center server cooling room still is important to the performance and reliability of the equipment in a data center. In some embodiments, one or more humidifiers may be installed in the mixing chamber 518 to condition the humidity of the air passing through the mixing chamber.

Figure 6:
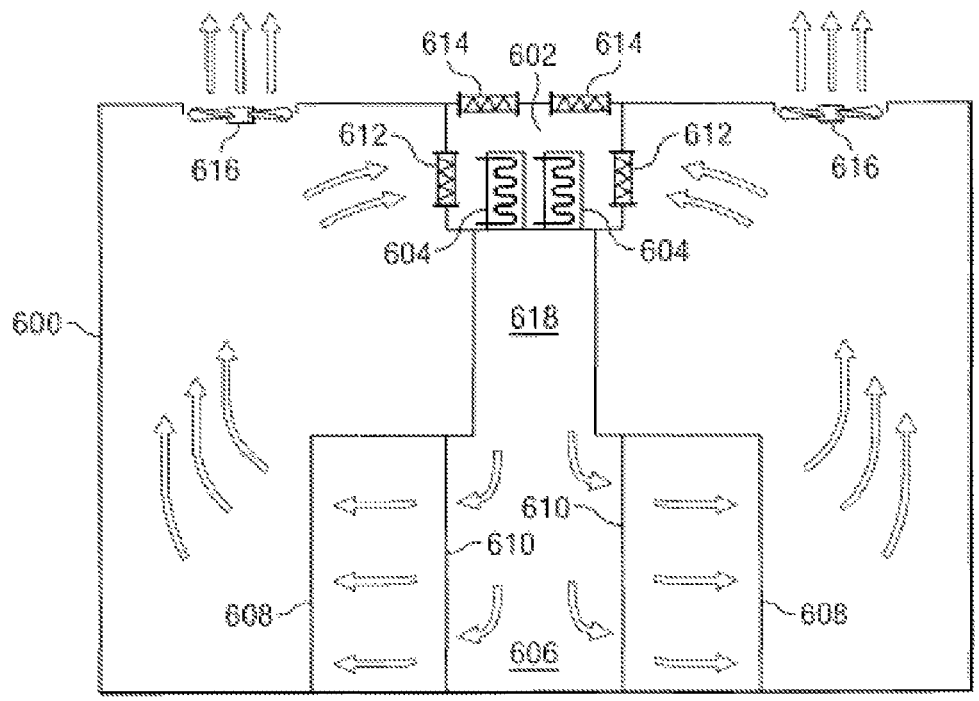
FIG. 6 is a diagram showing an example data center server cooling room with a cooling module that is integrated with a mixing chamber.

FIG. 6 illustrates another example data center server cooling room 600 with one or more ceiling exhaust fans 616, ceiling dampers 614 which controls outside air intake, a mixing chamber 602, and dampers 612 that controls circulation of hot air entering into the mixing chamber 602. In this embodiment, the cooling coils 604 are installed inside the mixing chamber 602. The mixing chamber 602 is connected to the cold row encapsulation structure 606 via a connection enclosure 618. Server rack ports 610 on the cold row encapsulation structure 606 are connected to the server racks 608. The servers may be installed into the server racks to achieve a front-to-back airflow pattern. The front face of the server racks 608 intersects the interior space of the cold row encapsulation structure 606. The server fans inside the servers draw cold air from the cold row encapsulation structure 606 to cool the servers and eject hot air from the back of the server racks.

In this embodiment, the server cooling room may have two modes of air flow depending on the outside temperature. In one mode, outside cool air enters the mixing chamber 602 through the open ceiling dampers 614 and is conditioned by the cooling coils 604. In some embodiments, humidifiers may be installed in the mixing chamber 602 to add moisture to the outside air. The conditioned cold air enters the cold row encapsulation structure 606 by gravity and generally lower pressure inside the interior space of the cold row encapsulation structure 606. The server fans in the servers installed on the racks draw the cold air from the cold row encapsulation structure 606 to cool the servers. When the outside air is hot and not appropriate for cooling purposes, the system operates in another mode whereby the ceiling dampers are closed to prevent hot outside air from entering the mixing chamber 602. The dampers 612, however, are open. Hot air inside the server cooling room enters the mixing chamber through the dampers 612 and exchanges heat with the cooling coils 604. In some embodiments, an electronic device monitors the temperature both inside and outside the server cooling room 600 and may open or close dampers 612 and 614 and the ceiling exhaust fans 616 depending on the inside and outside temperature. The same electronic device may further monitor the humidity level of the air both inside and outside the server cooling room and control the humidifiers that may be installed inside the mixing chamber 602.

Figure 7:
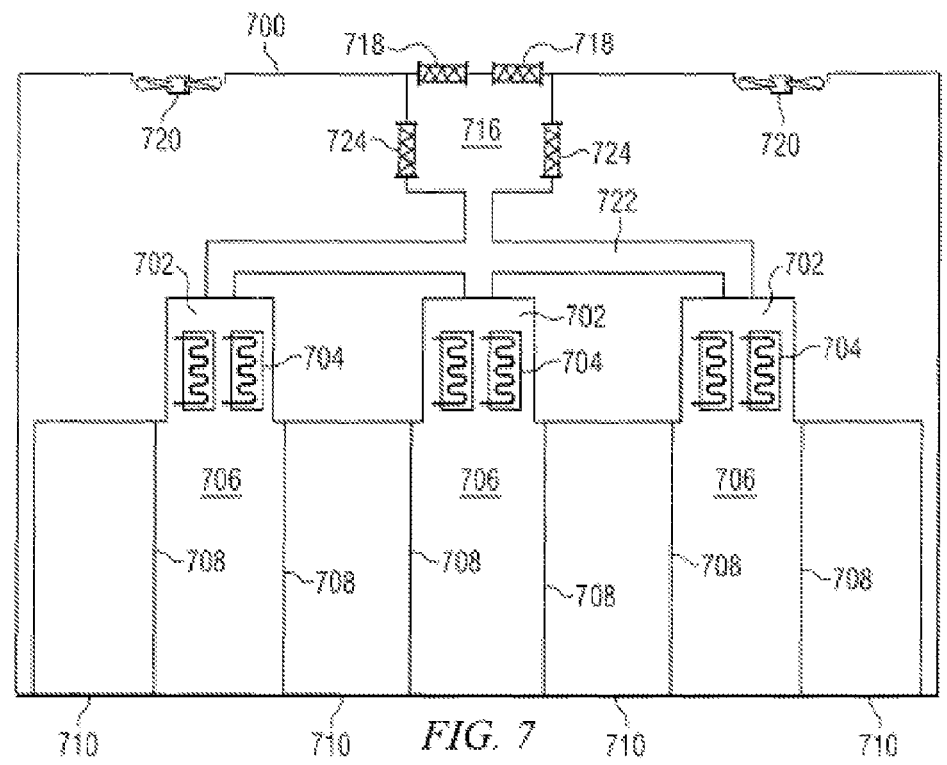
FIG. 7 is a diagram showing an example data center server cooling room with multiple cold row encapsulation structures and multiple cooling modules, exhaust fans on the roof, and a mixing chamber with dampers that controls the indoor and outdoor air circulation.

FIG. 7 illustrates a server cooling room 700 that is similar to the data center server cooling room shown in FIG. 6. The server cooling room 700, however, comprises multiple cooling modules 702 and multiple cold row encapsulation structures 706, one or more ceiling exhaust fans 720, one or more ceiling dampers 718, one or more mixing chambers 716 with one or more dampers 724, and multiple server racks 710. The multiple cooling modules 702 are connected to the mixing chamber 716 through enclosure 722. Server rack ports 708 on the enclosure of the cold row encapsulation structures 706 connect to the servers 710. The system operates in two modes as illustrated in FIG. 4. Air from the mixing chamber is cooled by the cooling coils 704 in each of the cooling modules before entering each individual cold row encapsulation structure 706.

Figure 8:
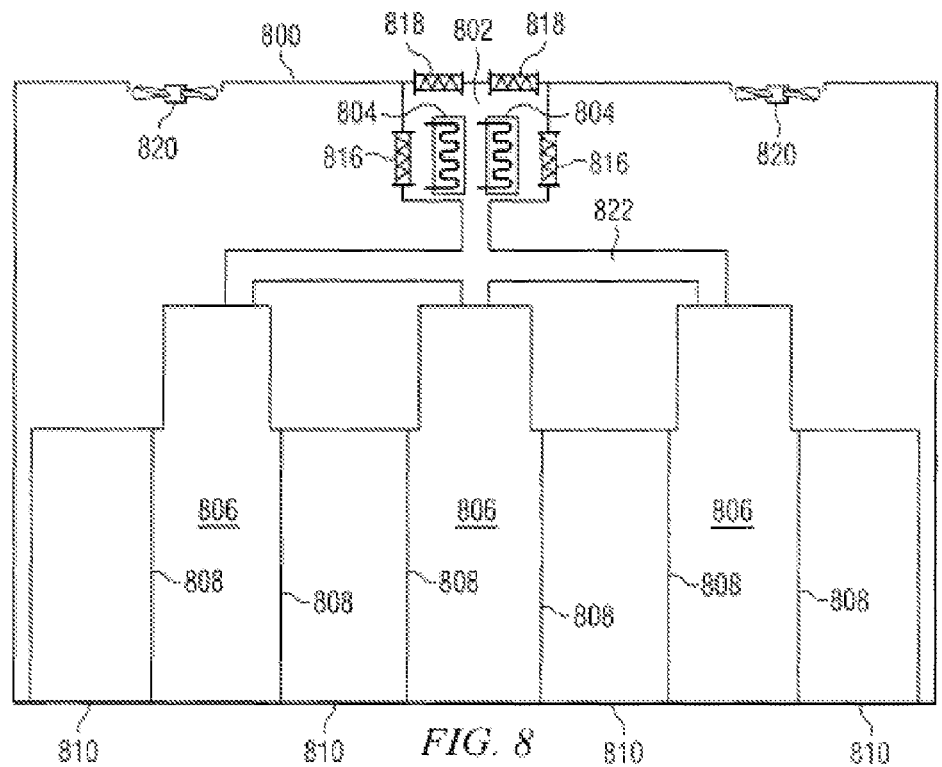
FIG. 8 is a diagram showing an example data center server cooling room with multiple cold row encapsulation structures and a cooling module that is integrated with a mixing chamber with dampers.

FIG. 8 illustrates a server cooling room 800 with one mixing chamber 802 and multiple cold row encapsulation structures 806. Cooling coils 804 are installed in the mixing chamber 802. The system operates in two modes as illustrated in FIG. 6. One or more ceiling dampers 818 may open or close depending on the temperature of the outside air. One or more dampers 816 may open or close to control hot air circulation inside the server cooling room 800. The top surface of each of the cold row encapsulation structures 806 is connected to the mixing chamber 802 through enclosure 822. Air from the mixing chamber is cooled by the cooling coils 804 before entering each individual cold row encapsulation structure 806 through the enclosure 822. However, unlike the server cooling room shown in FIG. 7, no individual cooling module is installed on top of each cold row enclosure structure 806. The server rack ports 808 on the enclosure of the cold row encapsulation structure 806 are connected to the server racks 810. Servers may be installed into the server racks 810 to achieve a front-to-back airflow pattern. The server fans inside the servers draw cold air from each individual cold row encapsulation structure 806 to cool the servers and eject hot air from the back of the server racks.

Figure 9:
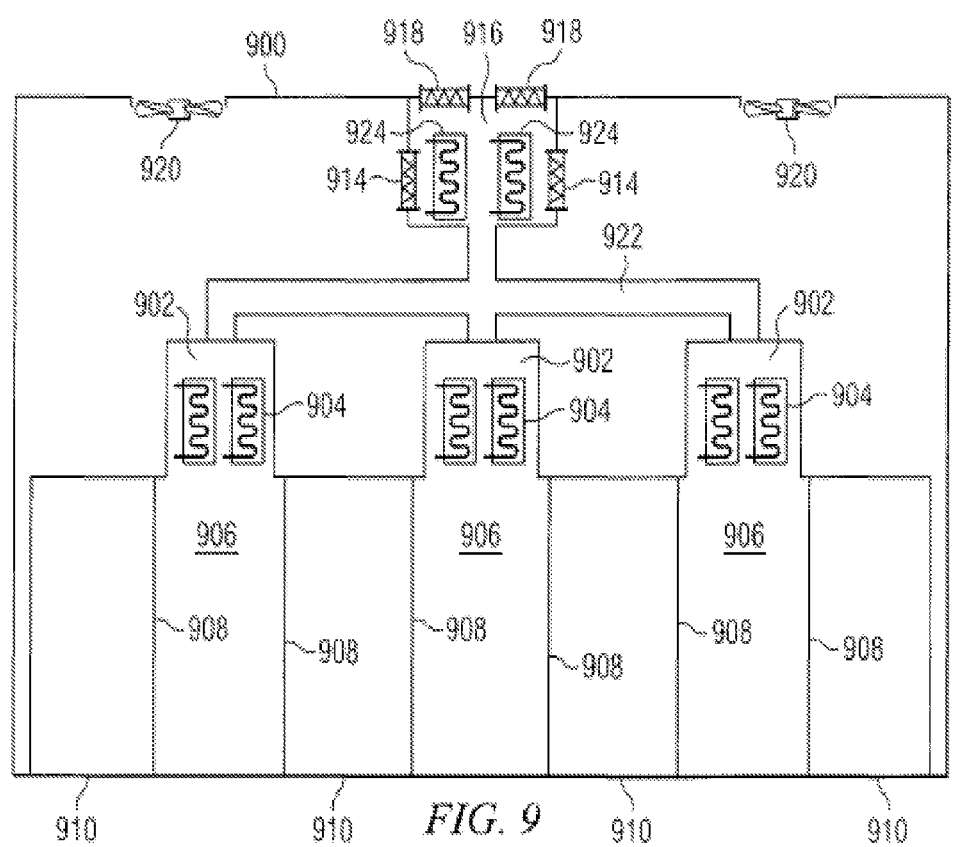
FIG. 9 is a diagram showing an example data center server cooling room with multiple cold row encapsulation structures and multiple cooling modules, exhaust fans on the roof, and a mixing chamber with dampers that is integrated with a cooling module.

FIG. 9 illustrates yet another server cooling room 900 with multiple cooling modules 902 and multiple cold row encapsulation structures 906, one or more ceiling exhaust fans 920, one or more ceiling dampers 918, one or more mixing chamber 916 with dampers 914, and multiple server racks 910. The system operates in two modes as illustrated in FIG. 8. However, unlike the server cooling room shown in FIG. 8, in addition to the cooling coils 904 in each cooling module 902, there are one or more cooling coils 924 installed in the mixing chamber 916 as well. The cooling modules are connected to one mixing chamber 916 through enclosure 922. Air from the mixing chamber is cooled by the cooling coils 924 in the mixing chamber 916 and is further cooled by each of the cooling modules 902 before entering each individual cold row encapsulation structure 906.

The present invention has been explained with reference to specific embodiments. For example, while embodiments of the present invention have been described with reference to specific components and configurations, those skilled in the art will appreciate that different combination of components and configurations may also be used. Other embodiments will be evident to those of ordinary skill in the art. It is therefore not intended that the present invention be limited, except as indicated by the appended claims.

What is claimed is:

1. A server cooling device, comprising:
    an enclosure defining an interior space and comprising at least one server rack port configured to engage a rack such that one or more rack mounted units installed in the rack interface with the interior space; and
    a mixing chamber including one or more cooling coils that is connected to the interior space defined by the enclosure.

2. The server cooling device of claim 1, wherein the at least one server rack port is configured to conform to an outer periphery of a server rack.

3. The server cooling device of claim 2, wherein the at least one server rack port can be sealed when attached to the at least one server rack.

4. The server cooling device of claim 3, wherein the at least one server rack port includes a gasket configured to seal a server rack within a corresponding server rack port.

5. The server cooling device of claim 1, wherein the server rack port comprises one or more racks on which one or more servers is placed.

6. The server cooling device of claim 1, wherein the mixing chamber includes one or more humidifiers.

7. The server cooling device of claim 6, wherein the humidifiers are controlled by an electronic device that monitors humidity of air inside and outside of a room housing the server cooling device.

8. A server cooling room, comprising:
    one or more openings whereby air inside and outside the server cooling room is exchanged;
    one or more server racks on which one or more servers is placed; and
    one or more cooling devices attached to the one or more server racks and attached to the one or more air intakes, each cooling device comprising an enclosure comprising at least one server rack port configured to interface with one or more server racks, the enclosure defining an interior space and a mixing chamber including one or more cooling coils that is connected to the interior space defined by the enclosure.

9. The server cooling room of claim 8, wherein the at least one server rack port is configured to interface with the one or more server racks such that a front face of the one or more server racks intersects the interior space.

10. The server cooling room of claim 8, wherein each of the one or more servers comprises one or more cooling fans operative to draw cold air from the cooling device.

11. The server cooling room of claim 8, wherein the at least one server rack port is configured to conform to an outer periphery of a server rack.

12. The server cooling room of claim 11, wherein the attachment between the at least one server rack and the at least one server rack port is sealed.

13. The server cooling room of claim 12, wherein the at least one server rack port comprises a gasket configured to seal a server rack within a corresponding server rack port.

14. The server cooling room of claim 8, wherein the mixing chamber includes one or more humidifiers.

15. The server cooling room of claim 14, wherein the humidifiers are controlled by an electronic device that monitors humidity of air inside and outside of the server cooling room.

16. The server cooling room of claim 8, wherein the mixing chamber further comprises:
    one or more integrated dampers adaptive to adjust the flow of air into and out of the mixing chamber; and
    an electronic device operative to control operation of the integrated dampers.

17. The server room of claim 16, wherein the electronic device is a temperature control unit that monitors temperature of air inside and outside of the server room.

18. The server room of claim 8, wherein liquid is used inside the cooling coils to cool ambient air.

19. A server cooling method, comprising
    encapsulating an interior space having at least one lateral portion defined by the front face of at least one server rack, wherein the at least one server rack comprises one or more servers mounted therein; and introducing air from a mixing chamber including one or more cooling coils that is connected to the interior space defined by an enclosure.

20. The method of claim 19, wherein the server rack is attached to the defined space.

* * * * *